United States Patent
Takeda et al.

(10) Patent No.: US 6,653,044 B2
(45) Date of Patent: Nov. 25, 2003

(54) CHEMICAL AMPLIFICATION TYPE RESIST COMPOSITION

(75) Inventors: Takanobu Takeda, Nakakubiki-gun (JP); Osamu Watanabe, Nakakubiki-gun (JP); Jun Watanabe, Nakakubiki-gun (JP); Jun Hatakeyama, Nakakubiki-gun (JP); Tsunehiro Nishi, Nakakubiki-gun (JP); Takeshi Kinsho, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 88 days.

(21) Appl. No.: 09/760,716

(22) Filed: Jan. 17, 2001

(65) Prior Publication Data

US 2001/0036593 A1 Nov. 1, 2001

(30) Foreign Application Priority Data

Jan. 17, 2000 (JP) ......................................... 2000-007888

(51) Int. Cl.[7] ........................... C07C 69/74; G03F 7/039
(52) U.S. Cl. ................. 430/270.1; 430/176; 430/286.1; 430/905; 430/909; 526/313; 526/242; 528/497
(58) Field of Search .............................. 430/270.1, 176, 430/281.1, 286.1, 905, 909; 526/242, 313; 528/497

(56) References Cited

U.S. PATENT DOCUMENTS

| | | | |
|---|---|---|---|
| 4,491,628 A | * 1/1985 | Ito et al. ..................... | 430/176 |
| 5,492,792 A | 2/1996 | Tamura et al. | |
| 5,750,309 A | 5/1998 | Hatakeyama et al. | |
| 5,844,057 A | * 12/1998 | Watanabe et al. ........... | 526/313 |
| 5,929,271 A | 7/1999 | Hada et al. | |
| 5,972,559 A | * 10/1999 | Watanabe et al. ......... | 430/270.1 |
| 5,985,512 A | * 11/1999 | Hatakeyama et al. .... | 430/270.1 |
| 6,004,720 A | 12/1999 | Takechi et al. | |
| 6,022,665 A | * 2/2000 | Watanabe et al. ......... | 430/270.1 |
| 6,132,926 A | * 10/2000 | Jung et al. ................ | 430/270.1 |
| 6,147,249 A | * 11/2000 | Watanabe et al. ........... | 560/120 |
| 6,156,477 A | 12/2000 | Motomi et al. | |
| 6,156,481 A | 12/2000 | Takeda et al. | |
| 6,362,315 B2 | * 3/2002 | Akkara et al. .............. | 528/497 |
| 2001/0035394 A1 | * 11/2001 | Takeda et al. ................ | 216/41 |
| 2001/0036593 A1 | * 11/2001 | Takeda et al. ........... | 430/270.1 |
| 2002/0004569 A1 | * 1/2002 | Hatakeyama et al. ....... | 526/242 |
| 2002/0039701 A1 | * 4/2002 | Takeda et al. ........... | 430/270.1 |

FOREIGN PATENT DOCUMENTS

| | | | | |
|---|---|---|---|---|
| EP | 0517428 A1 | 12/1992 | | |
| EP | 0663616 A2 | 7/1995 | | |
| EP | 0789279 A1 | 8/1997 | | |
| EP | 1117003 A1 | * 1/2001 | .......... | G03F/7/039 |
| EP | 1077391 A1 | 2/2001 | | |
| JP | 63-27829 | 2/1988 | | |
| JP | 2-27660 | 6/1990 | | |
| JP | 6-266112 | 9/1994 | | |
| JP | 8-101509 | 4/1996 | | |
| JP | 128930 | 5/2000 | | |
| JP | 159758 | 6/2000 | | |
| JP | 235263 | 8/2000 | | |

OTHER PUBLICATIONS

Machine translation of JP 2000–235263 obtained from JPO website: http://www1.ipdl.jpo.go.jp.*
Abstract of Japanese 2000–159758.
Abstract of Japanese 2000–128930.
Abstract of Japanese 2000–235263.
JP 63–27829 English language abstract.
JP 8–101509 English language abstract.

* cited by examiner

*Primary Examiner*—Janet Baxter
*Assistant Examiner*—Yvette C. Thornton
(74) *Attorney, Agent, or Firm*—Millen, White, Zelano & Branigan, P.C.

(57) ABSTRACT

A chemical amplification type resist composition uses as the base resin a polymer having a molecular weight dispersity of 1.0 to 1.5 which is a polymer comprising recurring units of formula (1) and recurring units of formula (2) or a polymer comprising recurring units of formula (2) wherein $R^1$ is alkyl, alkoxyalkyl, acetyl or carbonylalkoxy, $0<p/(p+q)\leq 1$, $R^2$ is hydrogen or methyl, and $R^3$ is a tertiary hydrocarbon group of 4 to 30 carbon atoms. By virtue of the narrow dispersity effect of the polymer, the resist composition is improved in resolution as compared with prior art base resins having a wide dispersity. Advantages including a high resolution, good pattern profile and storage stability are obtained.

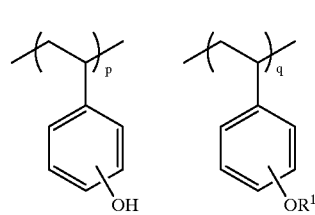

(1)

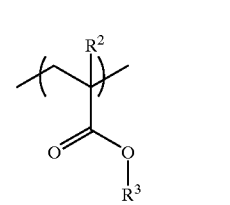

(2)

5 Claims, No Drawings

CHEMICAL AMPLIFICATION TYPE RESIST COMPOSITION

This invention relates to chemical amplification type resist compositions.

BACKGROUND OF THE INVENTION

While a number of efforts are currently being made to achieve a finer pattern rule in the drive for higher integration and operating speeds in LSI devices, lithography is thought to hold particular promise as the microfabrication technology. Deep UV, electron beam and x-ray lithography processes enable micropatterning to a feature size of 0.2 μm or less.

The recently developed, acid-catalyzed, chemical amplification type positive resist materials (see JP-B 2-27660 and JP-A 63-27829) utilize a high-intensity KrF excimer laser as the deep UV light source and are expected to comply with the deep UV lithography because of their many advantages including high sensitivity, resolution and dry etching resistance. For instance, JP-B 6-266112 and JP-A 8-101509 disclose hydroxystyrene and methacrylate copolymers. A need exists for a resist material capable of utilizing a high-intensity ArF excimer laser.

When micropatterning to a finer feature size is required, these resist materials fail to form a pattern of the desired line width or are unsatisfactory in sensitivity and resolution. There is a demand for a further improvement.

SUMMARY OF THE INVENTION

An object of the invention is to provide a chemical amplification type resist composition which is improved in sensitivity, resolution, exposure latitude, process adaptability and reproducibility over prior art resist compositions and is capable of forming a resist pattern having good plasma etching resistance and heat resistance.

It has been found that a chemical amplification type resist composition using a base resin having a narrow dispersity (or polydispersity index) as obtained by a specific method to be described later is improved in resolution, exposure latitude, and process adaptability. This composition is advantageous in practical application and precise micropatterning and thus best suited as a resist material for the manufacture of VLSIs.

The base polymers previously developed for resist use have a wide dispersity and contain low molecular weight components because of their polymerization technique, especially radical polymerization, not considered to be living polymerization. Paying attention to the dispersity of a polymer, the inventor has found that when a polymer having a narrow dispersity, especially a polymer from which a low molecular weight component has been removed by fractionation, is formulated in a chemical amplification type resist composition as the base resin, the resulting resist composition has a noticeably increased contrast of alkali dissolution rate before and after exposure, high sensitivity, high resolution and is suited as a micropatterning resist material for the manufacture of VLSIs.

According to the invention, there is provided a chemical amplification type resist composition comprising a polymer having a molecular weight dispersity of 1.0 to 1.5, and especially 1.0 to 1.4. The polymer is a polymer comprising recurring units of formula (1) and recurring units of formula (2), a polymer comprising recurring units of formula (2), a polymer comprising recurring units of formula (2) and recurring units of formula (4), a polymer comprising recurring units of formula (3), or a polymer comprising recurring units of formula (4), the formulas being shown below.

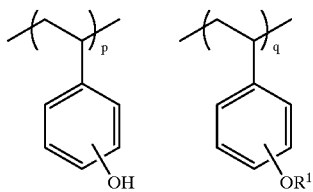

(1)

Herein $R^1$ is an alkyl, alkoxyalkyl, acetyl or carbonylalkoxy group, each unit may be of one type or a mixture of at least two types, p is a positive number, q is 0 or a positive number, satisfying $0<p/(p+q)\leq 1$.

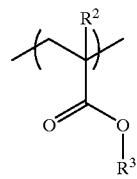

(2)

Herein $R^2$ is hydrogen or methyl, and $R^3$ is a tertiary hydrocarbon group of 4 to 30 carbon atoms.

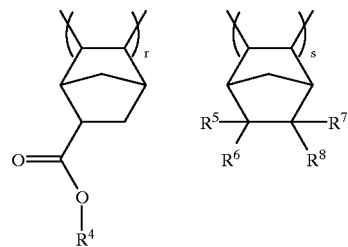

(3)

Herein $R^4$ is a tertiary hydrocarbon group of 4 to 30 carbon atoms, $R^5$ to $R^8$ are independently selected from the group consisting of a hydrogen atom, ester group, alkoxycarbonylalkyl group, lactone group, carboxyl group, and cyclic acid anhydride group, or two of $R^5$ to $R^8$, taken together, may form a cyclic lactone group or acid anhydride group, r is a positive number, s is 0 or a positive number, satisfying $0<r/(r+s)\leq 1$.

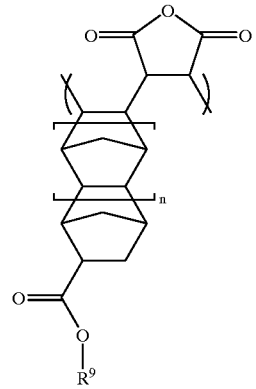

(4)

Herein $R^9$ is a tertiary hydrocarbon group of 4 to 30 carbon atoms, and n is equal to 0 or 1.

In one preferred embodiment, the polymer having a molecular weight dispersity of 1.0 to 1.5 has been fractionated from a starting polymer containing a low molecular weight component by dissolving the starting polymer in a good solvent, admitting the resulting solution into a poor solvent, and fractionally removed the low molecular weight component in the starting polymer. The poor solvent and the good solvent are preferably selected in accordance with the starting polymer from the group consisting of water, acetone, ethyl acetate, methyl acetate, diethyl ether, tetrahydrofuran, cyclohexanone, diethylene glycol dimethyl ether, 1-ethoxy-2-propanol, propylene glycol monomethyl ether acetate, ethyl lactate, methanol, ethanol, isopropyl alcohol, pentane, hexane, toluene, benzene, and xylene.

By virtue of the narrow dispersity effect of the polymer, the chemically amplified resist composition having the narrow dispersity polymer formulated therein is improved in performance as compared with prior art base resins having a wide dispersity. As compared with base resins obtained by radical polymerization of hydroxystyrene and methacrylate, for example, a base resin having a dispersity narrowed to about 1.4 provides an improved resolution. Also since the low molecular weight fraction is removed from the polymer, the resist pattern shape is precisely defined and the stability as resist is improved.

DESCRIPTION OF THE PREFERRED EMBODIMENT

The chemical amplification type resist composition of the invention comprises a polymer comprising recurring units of formula (1) and recurring units of formula (2), a polymer comprising recurring units of formula (2), a polymer comprising recurring units of formula (2) and recurring units of formula (4), a polymer comprising recurring units of formula (3), or a polymer comprising recurring units of formula (4).

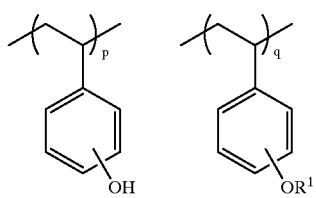

(1)

Herein $R^1$ is an alkyl, alkoxyalkyl, acetyl or carbonylalkoxy group, each unit may be of one type or a mixture of at least two types, p is a positive number, q is 0 or a positive number, satisfying $0 < p/(p+q) \leq 1$.

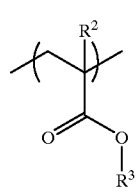

(2)

Herein $R^2$ is hydrogen or methyl, and $R^3$ is a tertiary hydrocarbon group of 4 to 30 carbon atoms.

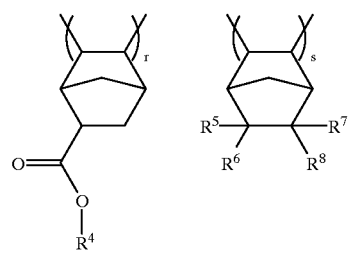

(3)

Herein $R^4$ is a tertiary hydrocarbon group of 4 to 30 carbon atoms, $R^5$ to $R^8$ are independently selected from the group consisting of a hydrogen atom, ester group, alkoxycarbonylalkyl group, lactone group, carboxyl group, and cyclic acid anhydride group, or two of $R^5$ to $R^8$, taken together, may form a cyclic lactone group or acid anhydride group, r is a positive number, s is 0 or a positive number, satisfying $0 < r/(r+s) \leq 1$.

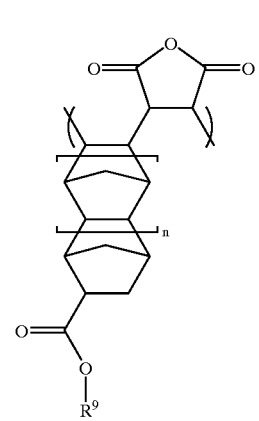

(4)

Herein $R^9$ is a tertiary hydrocarbon group of 4 to 30 carbon atoms, and n is equal to 0 or 1.

More particularly, the alkyl groups represented by $R^1$ are preferably straight, branched or cyclic alkyl groups of 1 to 20 carbon atoms, especially 1 to 10 carbon atoms, for example, methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl, and cyclohexylethyl. The alkoxyalkyl groups represented by $R^1$ are preferably straight, branched or cyclic groups of 2 to 20 carbon atoms, especially 2 to 10 carbon atoms, for example, straight or branched acetal groups such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as tetrahydrofuranyl and tetrahydropyranyl. Of these, ethoxyethyl, butoxyethyl and ethoxypropyl are preferred. The carbonylalkoxy groups represented by $R^1$ are preferably those of 2 to 20 carbon atoms, especially 2 to 10 carbon atoms, for example, tert-butoxycarbonyl and tert-butoxycarbonylmethyl.

The tertiary hydrocarbon groups represented by $R^3$, $R^4$ and $R^9$ are preferably tertiary alkyl groups of 4 to 30 carbon atoms, especially 4 to 20 carbon atoms, and 1-substituted cycloalkyl groups in which the hydrogen atom at 1-position on cycloalkyl is replaced by an alkyl group, an alkenyl group such as vinyl, an aryl group such as phenyl, a cyano group or an acyl group such as acetyl. Illustrative, non-limiting, examples are tert-butyl, 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

Examples of the ester groups represented by $R^5$ to $R^8$ include methyl esters and ethyl esters. The alkoxycarbonylalkyl group preferably has 3 to 10 carbon atoms, especially 3 to 6 carbon atoms. Examples of the alkoxycarbonylalkyl group include methoxycarbonylmethyl group and t-butoxycarbonylmethyl group. Exemplary lactone groups are 5-, 6- and 7-membered ring lactones. Examples of the cyclic acid anhydride group include succinic anhydride and glutaric anhydride.

The letter p is a positive number, q is 0 or a positive number, satisfying $0<p/(p+q)\leq 1$, preferably $0.1\leq p/(p+q)\leq 0.95$, and more preferably $0.6\leq p/(p+q)\leq 0.8$. The letter r is a positive number, s is 0 or a positive number, satisfying $0<r/(r+s)\leq 1$, preferably $0.1\leq r/(r+s)\leq 0.9$, and more preferably $0.4\leq r/(r+s)\leq 0.6$.

Preferably the polymer used herein has a weight average molecular weight of about 500 to 10,000,000, especially about 5,000 to 20,000.

According to the invention, the polymer should have a molecular weight dispersity of 1.0 to 1.5, preferably 1.0 to 1.4, and more preferably 1.0 to 1.35. The molecular weight dispersity, also known as polydispersity index, is given as weight average molecular weight divided by number average molecular weight (Mw/Mn).

The polymer having a molecular weight dispersity within the above range can be obtained from a starting polymer having a molecular weight dispersity in excess of 1.5 by a fractionating method of removing a low molecular weight component by utilizing the differential solubility in a good solvent and a poor solvent between polymer components in terms of molecular weight.

The good solvent and the poor solvent used for the removal of the low molecular weight component may be selected, in accordance with the starting polymer, from the group consisting of water, acetone, ethyl acetate, methyl acetate, diethyl ether, tetrahydrofuran, cyclohexanone, diethylene glycol dimethyl ether, 1-ethoxy-2-propanol, propylene glycol monomethyl acetate, ethyl lactate, methanol, ethanol, isopropyl alcohol, pentane, hexane, toluene, benzene, and xylene.

The polymer having a molecular weight dispersity of 1.0 to 1.5 is fractionated from a starting polymer containing a relatively large amount of a low molecular weight component and having a molecular weight dispersity in excess of 1.5. First a good solvent for the starting polymer is selected. The starting polymer is admitted into the good solvent to dissolve it in the good solvent. This good solvent solution is then admitted into a poor solvent for the starting polymer, whereupon the low molecular weight component in the starting polymer is dissolved in the poor solvent to separate into two layers, whereby the low molecular weight component can be fractionated from the high molecular weight component. The layer in which the high molecular weight component is dissolved may be again admitted into a poor solvent to crystallise out, if necessary after concentration, and collect the high molecular weight component by filtration. There is obtained a polymer fraction having a dispersity of 1.0 to 1.5, especially 1.0 to 1.4 from which the low molecular weight component has been fractionated and removed. It is preferred in the invention to use a polymer having a narrow molecular weight dispersity as obtained by the fractionating method.

The chemical amplification type resist composition of the invention is especially suited as positive working resist. In addition to the above polymer as the base polymer, the composition may have formulated therein conventional components including organic solvents, photoacid generators, dissolution inhibitors, basic compounds, and other components.

Illustrative, non-limiting, examples of the organic solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The amount of the organic solvent is preferably in the range of 300 to 2,000 parts by weight, preferably 400 to 1,000 parts by weight per 100 parts by weight of the base polymer.

It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred. These solvents may be used alone or in admixture. An exemplary useful solvent mixture is a mixture of a propylene glycol alkyl ether acetate and an alkyl lactate. The mixing ratio of the propylene glycol alkyl ether acetate and the alkyl lactate is not critical although it is preferred to mix 50 to 99 parts by weight of the propylene glycol alkyl ether acetate with 50 to 1 parts by weight of the alkyl lactate. It is more preferred to mix 60 to 95% by weight of the propylene glycol alkyl ether acetate with 40 to 5% by weight of the alkyl lactate. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Examples of the photoacid generator, that is, a compound capable of generating an acid upon exposure to high energy radiation are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)-phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, diphenylmethylsulfonium, methyl-2-oxopropylphenylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexylcarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Of these photoacid generators, the sulfonium salts, bis-sulfonyldiazomethane compounds, and N-sulfonyloxyimide compounds are preferred. While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

An appropriate amount of the photoacid generator is 0.5 to 20 parts, and especially 1 to 10 parts by weight per 100 parts by weight of the base polymer in the resist composition. The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate an acid, that is, acid-propagating compound. For these compounds, reference should be made to J. Photopolym. Sci. and Tech., 8, 43–44, 45–46 (1995), and ibid., 9, 29–30 (1996).

Examples of the acid-propagating compound include tert-butyl-2-methyl-2-tosyloxymethyl acetoacetate and 2-phenyl-2-(tosyloxyethyl)-1,3-dioxoran, but are not limited thereto. Of well-known photoacid generators, many of those compounds having poor stability, especially poor thermal stability exhibit an acid-propagating compound-like behavior.

An appropriate amount of the acid-propagating compound is up to 2 parts, and especially up to 1 part by weight per 100 parts by weight of the base polymer in the resist composition. Excessive amounts of the acid-propagating compound makes diffusion control difficult, leading to degradation of resolution and pattern configuration.

The dissolution inhibitor used herein is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as those exemplified as the acid labile groups in the polymer.

Illustrative, non-limiting, examples of the dissolution inhibitors which are useful herein include
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4'-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl) valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

An appropriate amount of the dissolution inhibitor is up to 20 parts, and especially up to 15 parts by weight per 100 parts by weight of the solids in the resist composition. With more than 20 parts of the dissolution inhibitor, the resist composition becomes less heat resistant because of an increased content of monomer components.

The basic compound used herein is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetra- ethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Also useful are substituted ones of the hydroxyl group-bearing nitrogenous compounds in which some or all of the hydrogen atoms of hydroxyl groups are replaced by methyl, ethyl, methoxymethyl, methoxyethoxymethyl, acetyl, or ethoxyethyl groups. Preferred are methyl-, acetyl-, methoxymethyl- and methoxyethoxymethyl-substituted compounds of ethanolamine, diethanolamine and triethanolamine. Examples include tris(2-methoxyethyl)amine, tris(2-ethoxyethyl)amine, tris(2-acetoxyethyl)amine, tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, and tris[2-{(2-hydroxyethoxy)ethoxy}ethyl]amine.

The basic compounds may be used alone or in admixture of two or more. The basic compound is preferably formulated in an amount of 0 to 2 parts, and especially 0.01 to 1 part, per 100 parts by weight of the base polymer in the resist composition. The use of more than 2 parts of the basis compound would result in too low a sensitivity.

In the resist composition, there may be added additives such as a surfactant for improving applicability and a light absorbing substance for reducing diffuse reflection from the substrate.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products K.K.), Megaface F171, F172 and F173 (Dai-Nippon Ink & Chemicals K.K.), Florade FC430 and FC431 (Sumitomo 3M K.K.), Aashiguard AG710, Surflon S-381, S-382, SC101, SC102, SC103, SC104, SC105, SC106, Surfynol E1004, KH-10, KH-20, KH-30 and KH-40 (Asahi Glass K.K.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, FC430, Surflon S-381 and Surfynol E1004 are preferred. These surfactants may be used alone or in admixture.

The surfactant is preferably formulated in an amount of up to 2 parts, and especially up to 1 part, per 100 parts by weight of the base polymer in the resist composition.

In the resist composition, a UV absorber may be blended. Exemplary UV absorbers are fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, naphthalene, pleiadene, picene, perylene, pentaphene, pentacene, benzophenanthrene, anthraquinone, anthrone, benzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and compounds of the following formulae (D1) and (D2); fused heterocyclic derivatives such as thioxanthen-9-one, thianthrene, dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; squalic acid derivatives such as squalic acid and dimethyl squalate; diaryl sulfoxide derivatives such as bis(4-hydroxyphenyl) sulfoxide, bis(4-tert-butoxyphenyl) sulfoxide, bis(4-tert-butoxycarbonyloxyphenyl) sulfoxide, and bis[4-(1-ethoxyethoxy)phenyl]sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl]sulfone; diazo compounds such as benzoquinonediazide, naphthoquinonediazide, anthraquinonediazide, diazofluorene, diazotetralone, and diazophenanthrone; quinonediazide group-containing compounds such as complete or partial ester compounds between naphthoquinone-1,2-diazide-5-sulfonic acid chloride and 2,3,4-trihydroxybenzophenone and complete or partial ester compounds between naphthoquinone-1,2-diazide-4-sulfonic acid chloride and 2,4,4'-trihydroxybenzophenone; tert-butyl 9-anthracenecarboxylate, tert-amyl 9-anthracenecarboxylate, tert-methoxymethyl 9-anthracenecarboxylate, tert-ethoxyethyl 9-anthracenecarboxylate, 2-tert-tetrahydropyranyl 9-anthracenecarboxylate, and 2-tert-tetrahydrofuranyl 9-anthracenecarboxylate.

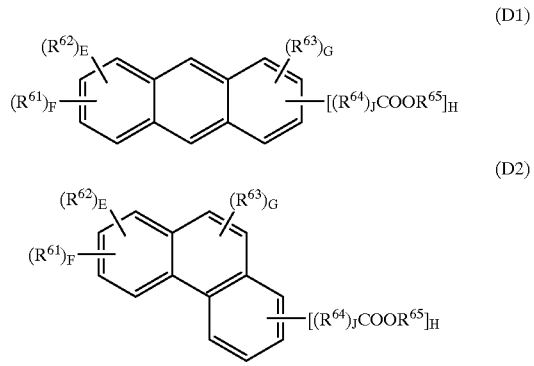

Herein, $R^{61}$ to $R^{63}$ are independently hydrogen or a straight or branched alkyl, straight or branched alkoxy, straight or branched alkoxyalkyl, straight or branched alkenyl or aryl group. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. $R^{65}$ is an acid labile group as described above. Letter J is equal to 0 or 1, E, F and G are 0 or integers of 1 to 9, H is a positive integer of 1 to 10, satisfying E+F+G+H≦10.

An appropriate amount of UV absorber blended is 0 to 10 parts, more preferably 0.5 to 10 parts, most preferably 1 to 5 parts by weight per 100 parts by weight of the base polymer.

For the microfabrication of integrated circuits, any well-known lithography may be used to form a resist pattern from the chemical amplification type resist composition according to the invention. The invention is not limited to the lithography.

The composition is applied onto a substrate (e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 µm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, electron beams, x-rays, excimer laser light, γ-rays and synchrotron radiation. With any of the above-described parameters outside the above-described range, the process may sometimes fail to produce the desired pattern.

By virtue of the narrow dispersity effect of the polymer, the chemically amplified resist composition of the invention is improved in resolution as compared with prior art base resins having a wide dispersity. Also since the low molecular weight fraction is removed from the polymer, the resist pattern shape is precisely defined and the storage stability as resist is improved. Advantages including a high resolution, good pattern profile and storage stability are obtained as compared with prior art resist composition.

EXAMPLE

Synthetic Examples, Examples and Comparative Examples are given below by way of illustration, but not intended to limit the scope of the invention.

Synthetic Example 1

A 2-liter flask was charged with 113.4 g of acetoxystyrene, 54.7 g of 1-ethylcyclopentyl methacrylate, and 1.5 liters of toluene as a solvent. The reactor was cooled to −70° C. in a nitrogen atmosphere, following which evacuation to vacuum and nitrogen flow were repeated three times. After the reactor was warmed to room temperature, 13.1 g of 2,2'-azobisisobutyronitrile (AIBN) was added as a polymerization initiator, and the reactor was heated at 60° C., at which reaction was effected for 15 hours. The reaction solution was concentrated to a ½ volume and poured into 10 liters of methanol whereupon white solids precipitated. The white solids were collected by filtration and dried in vacuum at 60° C., obtaining 132 g of a white polymer. The polymer was dissolved again in 0.5 liter of methanol and 1.0 liter of tetrahydrofuran, to which 140 g of triethylamine and 30 g of water were added for effecting deblocking reaction. The reaction solution was neutralized with acetic acid, concentrated and dissolved in 0.5 liter of acetone. Through precipitation, filtration and drying steps as above, 109 g of a white polymer was obtained.

The polymer was analyzed by $^{13}$C-NMR, $^1$H-NMR, and GPC, with the results shown below.

Copolymer compositional ratio hydroxystyrene:1-ethylcyclopentyl methacrylate=72:28

Weight average molecular weight (Mw)=11,000

Molecular weight dispersity (Mw/Mn)=1.65

This polymer is designated (poly-1).

Next, 50 g of (poly-1) was dissolved in 200 ml of acetone (good solvent), then crystallized in 10 liters of diethyl ether (poor solvent). After one hour of holding, the solution separated into two layers. The lower layer (or polymer layer) was separated, precipitated in 10 liters of hexane solvent, filtered and dried, obtaining 42 g of a white polymer.

Weight average molecular weight (Mw)=12,800

Molecular weight dispersity (Mw/Mn)=1.31

This polymer is designated (poly-B1).

Synthetic Example 2

A 2-liter flask was charged with 113.4 g of acetoxystyrene, 56.8 g of 1-ethylcyclohexyl methacrylate, and 1.5 liters of toluene as a solvent. The reactor was cooled to −70° C. in a nitrogen atmosphere, following which evacuation to vacuum and nitrogen flow were repeated three times. After the reactor was warmed to room temperature, 12.9 g of AIBN was added as a polymerization initiator, and the reactor was heated at 60° C., at which reaction was effected for 15 hours. The reaction solution was concentrated to a ½ volume and poured into 10 liters of methanol whereupon white solids precipitated. The white solids were collected by filtration and dried in vacuum at 60° C., obtaining 135 g of a white polymer. The polymer was dissolved again in 0.5 liter of methanol and 1.0 liter of tetrahydrofuran, to which 140 g of triethylamine and 30 g of water were added for effecting deblocking reaction. The reaction solution was neutralized with acetic acid, concentrated and dissolved in 0.5 liter of acetone. Through precipitation, filtration and drying steps as above, 110 g of a white polymer was obtained.

The polymer was analyzed by $^{13}$C-NMR, $^1$H-NMR, and GPC, with the results shown below.

Copolymer compositional ratio hydroxystyrene:1-ethylcyclohexyl methacrylate=73:27

Weight average molecular weight (Mw)=10,900

Molecular weight dispersity (Mw/Mn)=1.62

This polymer is designated (poly-2).

Next, 50 g of (poly-2) was dissolved in 200 ml of acetone (good solvent), then crystallized in a mixture of 10 liters of hexane and 0.5 liter of ethyl acetate (poor solvent). After one hour of holding, the solution separated into two layers. The lower layer (or polymer layer) was separated, precipitated in 10 liters of hexane solvent, filtered and dried, obtaining 40 g of a white polymer.

Weight average molecular weight (Mw)=13,000

Molecular weight dispersity (Mw/Mn)=1.32

This polymer is designated (poly-B2).

Synthetic Example 3

A 1-liter flask was charged with 296.2 g of 1-ethylcyclopentyl bicyclo[2.2.1]hept-5-ene-2-carboxylate, 118.0 g of maleic anhydride, and 100 g of dioxane as a solvent. The reactor was cooled to −70° C. in a nitrogen atmosphere, following which evacuation to vacuum and nitrogen flow were repeated three times. After the reactor was warmed to room temperature, 17.9 g of AIBN was added as a polymerization initiator, and the reactor was heated at 60° C., at which reaction was effected for 15 hours. The reaction solution was poured into 10 liters of isopropyl alcohol whereupon white solids precipitated. The white solids were collected by filtration and dried in vacuum at 60° C., obtaining 290 g of a white polymer.

The polymer was analyzed by $^{13}$C-NMR, $^1$H-NMR, and GPC, with the results shown below.

Copolymer compositional ratio 1-ethylcyclopentyl bicyclo[2.2.1]hept-5-ene-2-carboxylate:maleic anhydride=50:50

Weight average molecular weight (Mw)=8,700

Molecular weight dispersity (Mw/Mn)=1.63

This polymer is designated (poly-3).

Next, 50 g of (poly-3) was dissolved in 200 ml of acetone (good solvent), then crystallized in 10 liters of diethyl ether (poor solvent). After one hour of holding, the solution separated into two layers. The lower layer (or polymer layer) was separated, precipitated in 10 liters of hexane solvent, filtered and dried, obtaining 39 g of a white polymer.

Weight average molecular weight (Mw)=11,000

Molecular weight dispersity (Mw/Mn)=1.35

This polymer is designated (poly-B3).

Synthetic Example 4

A 1-liter flask was charged with 309.5 g of 1-ethylcyclohexyl bicyclo[2.2.1]hept-5-ene-2-carboxylate, 110.0 g of maleic anhydride, and 100 g of dioxane as a solvent. The reactor was cooled to −70° C. in a nitrogen atmosphere, following which evacuation to vacuum and nitrogen flow were repeated three times. After the reactor was warmed to room temperature, 17.1 g of AIBN was added as a polymerization initiator, and the reactor was heated at 60° C., at which reaction was effected for 15 hours. The reaction solution was poured into 10 liters of isopropyl alcohol whereupon white solids precipitated. The white solids were collected by filtration and dried in vacuum at 60° C., obtaining 299 g of a white polymer.

The polymer was analyzed by $^{13}$C-NMR, $^1$H-NMR, and GPC, with the results shown below.

Copolymer compositional ratio 1-ethylcyclohexyl bicyclo[2.2.1]hept-5-ene-2-carboxylate:maleic anhydride=50:50

Weight average molecular weight (Mw)=9,000

Molecular weight dispersity (Mw/Mn)=1.71

This polymer is designated (poly-4).

Next, 50 g of (poly-4) was dissolved in 200 ml of acetone (good solvent), then crystallized in a mixture of 10 liters of hexane and 1.0 liter of ethyl acetate (poor solvent). After one hour of holding, the solution separated into two layers. The lower layer (or polymer layer) was separated, precipitated in 10 liters of hexane solvent, filtered and dried, obtaining 39 g of a white polymer.

Weight average molecular weight (Mw)=11,700

Molecular weight dispersity (Mw/Mn)=1.31

This polymer is designated (poly-B4).

Synthetic Example 5

The following polymer was similarly prepared.

Copolymer compositional ratio 1-ethylcyclopentyl bicyclo[2.2.1]hept-5-ene-2-carboxylate:bicyclo[2.2.1]hept-5-ene-2-carboxylic acid=80:20

Weight average molecular weight (Mw)=13,000

Molecular weight dispersity (Mw/Mn)=1.82

This polymer is designated (poly-5).

Next, 50 g of (poly-5) was dissolved in 200 ml of acetone (good solvent), then crystallized in a mixture of 10 liters of hexane and 1.0 liter of ethyl acetate (poor solvent). After one hour of holding, the solution separated into two layers. The lower layer (or polymer layer) was separated, precipitated in 10 liters of hexane solvent, filtered and dried, obtaining 27 g of a white polymer.

Weight average molecular weight (Mw)=15,500

Molecular weight dispersity (Mw/Mn)=1.37

This polymer is designated (poly-B5).

Synthetic Example 6

The following polymer was similarly prepared.

Copolymer compositional ratio 1-ethylcyclopentyl bicyclo[2.2.1]hept-5-ene-2-carboxylate:5-methoxycarbonyl-5-methoxycarbonylmethyl-bicyclo[2.2.1]heptene=60:40

Weight average molecular weight (Mw)=11,000

Molecular weight dispersity (Mw/Mn)=1.77

This polymer is designated (poly-6).

Next, 50 g of (poly-6) was dissolved in 200 ml of acetone (good solvent), then crystallized in a mixture of 10 liters of hexane and 1.0 liter of ethyl acetate (poor solvent). After one hour of holding, the solution separated into two layers. The lower layer (or polymer layer) was separated, precipitated in 10 liters of hexane solvent, filtered and dried, obtaining 31 g of a white polymer.

Weight average molecular weight (Mw)=13,200

Molecular weight dispersity (Mw/Mn)=1.42

This polymer is designated (poly-B6).

The structural formulas of the synthesized polymers are shown below.

poly-1 poly-2

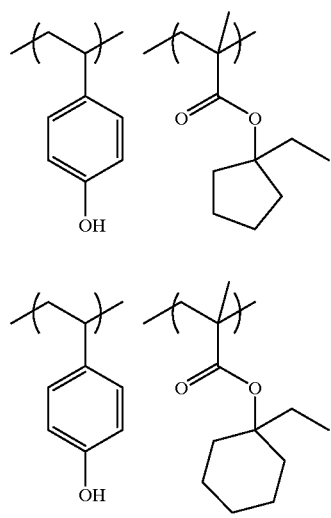

poly-3

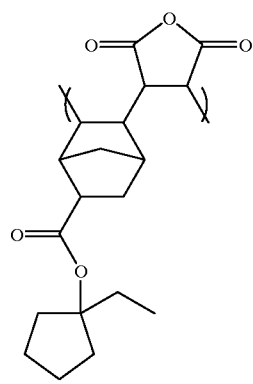

poly-4 poly-5

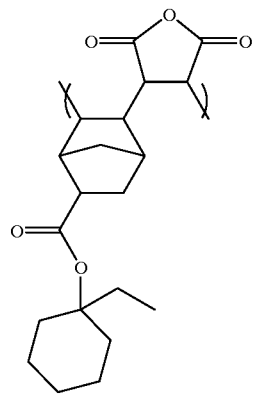

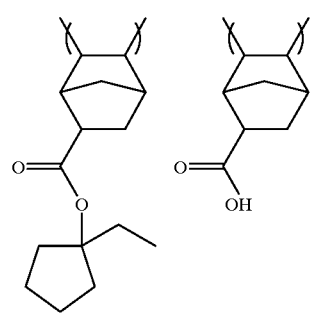

poly-6

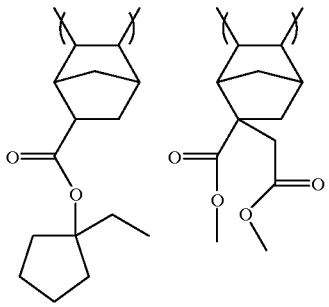

Examples 1, 2 and Comparative Examples 1, 2

Resist materials were formulated by dissolving 80 parts by weight of the above-synthesized polymer (poly-B1) or (poly-B2) as the base resin, 3 parts by weight of triphenylsulfonium p-toluenesulfonate as the photoacid generator, 0.1 part by weight of triethanolamine as the basic compound, 0.2 part by weight of 2,2-bis(4-t-butylcarboxyphenyl) propane as the dissolution inhibitor, in 530 parts by weight of a 7/3 mixture of propylene glycol monoethyl ether acetate and ethyl lactate. The resist materials thus obtained were each filtered through a 0.2-μm Teflon filter, thereby giving resist solutions.

For comparison purposes, resist solutions were similarly prepared using the polymers (poly-1) and (poly-2) as the base resin.

These resist solutions were spin-coated onto silicon wafers, then baked at 100° C. for 120 seconds on a hot plate to give resist films having a thickness of 0.8 μm. The resist films were exposed using a KrF excimer laser stepper NSR2005EX8A (Nikon K.K., NA 0.5), then baked (PEB) at 90° C. for 60 seconds, and developed with a solution of 2.38% tetramethylammonium hydroxide in water, thereby giving positive patterns.

The resulting resist patterns were evaluated as described below. The results are shown in Table 1.

Resist pattern evaluation

A sensitivity (Eth) was first determined. The exposure dose which provides a 1:1 resolution at the top and bottom of a 0.35-μm line-and-space pattern was evaluated as the optimum exposure dose (sensitivity Eop), and as a sensitivity (mJ/cm$^2$). Next, the minimum line width of a line-and-space pattern which was ascertained separate at this dose was the resolution of a test resist.

Also, the roughness of a 0.20-μm line-and-space pattern (pattern profile) was determined under a scanning electron microscope.

TABLE

| Polymer in resist | Sensitivity (mJ/cm$^2$) | Resolution (μm) | Pattern profile |
| --- | --- | --- | --- |
| E1 | Poly-B1 | 20 | 0.15 | good |
| E2 | Poly-B2 | 18 | 0.18 | good |
| CE1 | Poly-1 | 20 | 0.2 | rough |
| CE2 | Poly-2 | 20 | 0.2 | rough |

Examples 3–6 and Comparative Examples 3–6

Resist materials were formulated by dissolving 80 parts by weight of each of the above-synthesized polymers (poly-B3) to (poly-B6) as the base resin, 3 parts by weight of triphenylsulfonium trifluoromethanesulfonate as the photoacid generator, 0.1 part by weight of trismethoxymethoxyethylamine as the basic compound, and 0.2 part by weight of 2,2-bis(4-t-butylcarboxyphenyl)propane as the dissolution inhibitor in 530 parts by weight of a 7/3 mixture of propylene glycol monomethyl ether acetate and ethyl lactate. The resist materials thus obtained were each filtered through a 0.2-μm Teflon filter, thereby giving resist solutions.

For comparison purposes, resist solutions were similarly prepared using the polymers (poly-3) to (poly-6) as the base resin.

These resist solutions were spin-coated onto silicon wafers, then baked at 100° C. for 120 seconds on a hot plate to give resist films having a thickness of 0.8 μm. The resist films were exposed using an ArF excimer laser stepper (Nikon K.K., NA 0.55), then baked (PEB) at 110° C. for 90 seconds, and developed with a solution of 2.38% tetramethylammonium hydroxide in water, thereby giving positive patterns.

The resulting resist patterns were evaluated as described below. The results are shown in Table 2.

Resist pattern evaluation

A sensitivity (Eth) was first determined. The exposure dose which provides a 1:1 resolution at the top and bottom of a 0.25-μm line-and-space pattern was evaluated as the optimum exposure dose (sensitivity Eop), and as a sensitivity (mJ/cm$^2$). Next, the minimum line width of a line-and-space pattern which was ascertained separate at this dose was the resolution of a test resist.

Also, the roughness of a 0.20-μm line-and-space pattern (pattern profile) was determined under a scanning electron microscope.

TABLE 2

| | Polymer in resist | Sensitivity (mJ/cm$^2$) | Resolution (μm) | Pattern profile |
| --- | --- | --- | --- | --- |
| E3 | poly-B3 | 19 | 0.14 | good |
| E4 | poly-B4 | 20 | 0.13 | good |
| E5 | poly-B5 | 19 | 0.13 | good |
| E6 | poly-B6 | 20 | 0.13 | good |
| CE3 | poly-3 | 21 | 0.15 | rough |
| CE4 | poly-4 | 20 | 0.15 | rough |
| CE5 | poly-5 | 22 | 0.16 | rough |
| CE6 | poly-6 | 21 | 0.15 | rough |

It was confirmed from the data in Tables 1 and 2 that the chemically amplified positive resist compositions within the scope of the invention have a high resolution and form patterns of improved profile.

Japanese Patent Application No. 2000-007888 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A process for preparing a chemical amplification resist composition comprising preparing a polymer that has a molecular weight dispersity of 1.0 to 1.5 by radical polymerization, and is a polymer comprising recurring units of formula (1) and recurring units of formula (2), a polymer comprising recurring units of formula (2), a polymer comprising recurring units of formula (2) and recurring units of formula (4), a polymer comprising recurring units of formula (3), or a polymer comprising recurring units of formula (4),

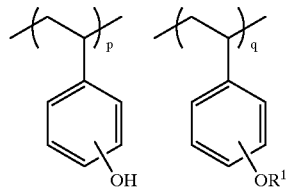

(1)

wherein R$^1$ is an alkyl, alkoxyalkyl, acetyl or carbonylalkoxy group, wherein the polymer contains one or a mixture of at least two different recurring units of formula (1), p is a positive number, q is 0 or a positive number, satisfying 0<p/(p+q)≦1,

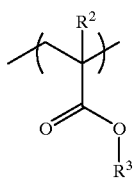
(2)

wherein $R^2$ is hydrogen or methyl, and $R^3$ is a tertiary hydrocarbon group of 4 to 30 carbon atoms,

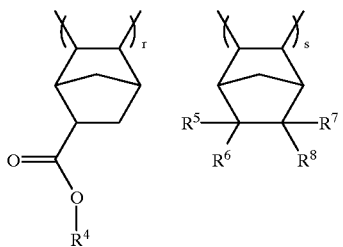
(3)

wherein $R^4$ is a tertiary hydrocarbon group of 4 to 30 carbon atoms, $R^5$ to $R^8$ are independently selected from the group consisting of a hydrogen atom, an ester group, an alkoxycarbonylalkyl group, a lactone group, a carboxyl group, and a cyclic acid anhydride group, or two of $R^5$ to $R^8$, taken together, optionally form a cyclic lactone group or acid anhydride group, r is a positive number, s is 0 or a positive number, satisfying $0<r/(r+s)\leq 1$,

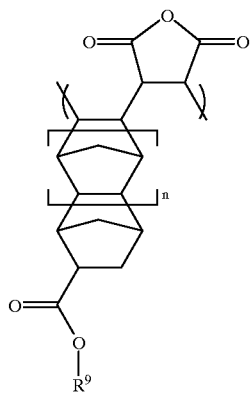
(4)

wherein $R^9$ is a tertiary hydrocarbon group of 4 to 30 carbon atoms, and n is equal to 0 or 1, by fractionating said polymer from a starting polymer that has a molecular weight dispersity of more than 1.5 and is selected from the group consisting of a polymer comprising recurring units of formula (1) and recurring units of formula (2), a polymer comprising recurring units of formula (2), a polymer comprising recurring units of formula (2) and recurring units of formula (4), a polymer comprising recurring units of formula (3), and a polymer comprising recurring units of formula (4), by dissolving the starting polymer in a first solvent wherein the starting polymer is dissolved, admitting the resulting solution into a second solvent, followed by separation of the first and second solvents into two layers, the first solvent containing a component of the starting polymer that has an average molecular weight that is higher than the average molecular weight of a component of the starting polymer that is in the second solvent, or containing a component of the starting polymer having a molecular weight dispersity of 1.0 to 1.5, and the second solvent containing a component of the starting polymer that has an average molecular weight that is lower than the average molecular weight of a component of the starting polymer that is in the first solvent, or containing a component of the starting polymer having a molecular weight dispersity of more than 1.5, followed by fractionally collecting the first solvent layer containing a component of the starting polymer that has an average molecular weight that is higher than the average molecular weight of a component of the starting polymer that is in the second solvent, or containing a component of the starting polymer having a molecular weight dispersity of 1.0 to 1.5.

2. A process according to claim 1, wherein the second solvent and the first solvent are selected from the group consisting of water, acetone, ethyl acetate, methyl acetate, diethyl ether, tetrahydrofuran, cyclohexanone, diethylene glycol dimethyl ether, 1-ethoxy-2-propanol, propylene glycol monomethyl ether acetate, ethyl lactate, methanol, ethanol, isopropyl alcohol, pentane, hexane, toluene, benzene, and xylene.

3. A process according to claim 1, further comprising adding additional second solvent, which may be the same or different than the second solvent used previously, to the final solution, optionally concentrating the resultant solution, followed by filtering the resultant solution.

4. A process for preparing a chemical amplification resist composition comprising preparing a polymer that has a molecular weight dispersity of 1.0 to 1.5, and is a polymer comprising recurring units of formula (2) and recurring units of formula (4), a polymer comprising recurring units of formula (3), or a polymer comprising recurring units of formula (4),

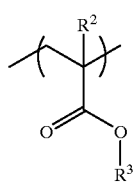
(2)

wherein $R^2$ is hydrogen or methyl, and $R^3$ is a tertiary hydrocarbon group of 4 to 30 carbon atoms,

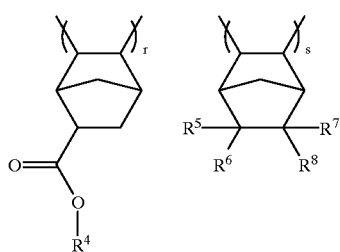
(3)

wherein $R^4$ is a tertiary hydrocarbon group of 4 to 30 carbon atoms, $R^5$ to $R^8$ are independently selected from the group consisting of a hydrogen atom, an ester group, an alkoxycarbonylalkyl group, a lactone group, a carboxyl group, and a cyclic acid anhydride group, or two of $R^5$ to $R^8$, taken together, optionally form a cyclic lactone group or acid anhydride group, r is a positive number, s is 0 or a positive number, satisfying $0<r/(r+s)\leq 1$,

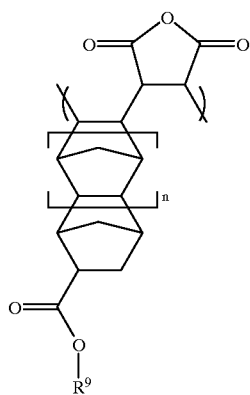

(4)

wherein $R^9$ is a tertiary hydrocarbon group of 4 to 30 carbon atoms, and n is equal to 0 or 1, by fractionating said polymer from a starting polymer that has a molecular weight dispersity of more than 1.5 and is selected from the group consisting of a polymer comprising recurring units of formula (2) and recurring units of formula (4), a polymer comprising recurring units of formula (3), and a polymer comprising recurring units of formula (4), by dissolving the starting polymer in a first solvent wherein the starting polymer is dissolved, admitting the resulting solution into a second solvent, followed by separation of the first and second solvents into two layers, the first solvent containing a component of the starting polymer that has an average molecular weight that is higher than the average molecular weight of a component of the starting polymer that is in the second solvent, or containing a component of the starting polymer having a molecular weight dispersity of 1.0 to 1.5, and the second solvent containing a component of the starting polymer that has an average molecular weight that is lower than the average molecular weight of a component of the starting polymer that is in the first solvent, or containing a component of the starting polymer having a molecular weight dispersity of more than 1.5, followed by fractionally collecting the first solvent layer containing a component of the starting polymer that has an average molecular weight that is higher than the average molecular weight of a component of the starting polymer that is in the second solvent, or containing a component of the starting polymer having a molecular weight dispersity of 1.0 to 1.5.

5. A process according to claim 1 or 4, wherein the first solvent is acetone and the second solvent is diethyl ether or a mixture of hexane and ethyl acetate.

* * * * *